United States Patent [19]

Miller, II

[11] Patent Number: 6,107,892

[45] Date of Patent: Aug. 22, 2000

[54] METHOD FOR REDUCTION OF PHASE NOISE IN MICROWAVE VOLTAGE-CONTROLLED OSCILLATORS

[75] Inventor: Robert Raymond Miller, II, Morris Township, Morris County, N.J.

[73] Assignee: AT&T Corp., New York, N.Y.

[21] Appl. No.: 09/291,337

[22] Filed: Apr. 14, 1999

Related U.S. Application Data

[60] Provisional application No. 60/113,390, Dec. 23, 1998.

[51] Int. Cl.[7] ............................ H03B 5/00; H03B 5/18
[52] U.S. Cl. .................... 331/105; 331/36 C; 331/96; 331/117 D; 331/108 D; 331/172; 331/175; 331/177 V
[58] Field of Search ........................ 331/34, 36 C, 331/46, 56, 96, 105, 108 D, 117 R, 117 FE, 117 D, 172, 175, 177 V

[56] References Cited

U.S. PATENT DOCUMENTS

| | | |
|---|---|---|
| 4,247,834 | 1/1981 | Brun et al. . |
| 4,567,449 | 1/1986 | Bert et al. .................... 331/56 |
| 4,831,339 | 5/1989 | Nemeth . |
| 5,019,791 | 5/1991 | Cohen . |
| 5,059,927 | 10/1991 | Cohen . |
| 5,379,309 | 1/1995 | Logan, Jr. . |
| 5,625,324 | 4/1997 | Hsu . |
| 5,668,507 | 9/1997 | Boerstler et al. .................... 331/78 |
| 5,789,961 | 8/1998 | Bulsara et al. .................... 327/355 |

OTHER PUBLICATIONS

"Injection Locking of Microwave Solid–State Oscillators" by Kaneyuki Korokawa, Proceedings of the IEEE, vol. 61, No. 10, Oct. 1973, pp. 1386–1410.

Primary Examiner—David Mis
Attorney, Agent, or Firm—A. G. Steinmetz

[57] ABSTRACT

Phase noise in an RF oscillator is significantly reduced by loosely couping another quieter RF oscillator having noise patterns uncorrelated to the first RF oscillator so that it frequency locks with the first RF oscillator. The coupling is increased until a significant reduction in phase noise occurs at high coupling levels where the first RF oscillator displays phase noise similar to the the second RF oscillator.

6 Claims, 2 Drawing Sheets

100

200

METHOD FOR REDUCTION OF PHASE NOISE IN MICROWAVE VOLTAGE-CONTROLLED OSCILLATORS

This appln. claims the benefit of U.S. Provisional No. 60/113,390 filed Dec. 23, 1998.

FIELD OF THE INVENTION

This invention relates to Voltage Controlled Oscillators (VCO) used in Phase Locked Loop (PLL) synthesizers. It is particularly concerned with synthesizers used in radio applications for generation of RF signals whose frequency accuracy is dependent upon a high precision reference. In particular the acceptable phase noise levels needed for high frequency wireless communications is a prime concern of the invention disclosed herein.

BACKGROUND OF THE INVENTION

Phase noise is an inherent problem in the design of radio circuitry. It is due mainly due to noise generated by active devices used with a tuning circuit for sustaining oscillations in the oscillator circuitry. It is considered to be due to modulation due to the 1/f baseband noise spectrum of the nonlinear transfer characteristic and limiting behavior of the active device. This phase noise is conventionally reduced by the filtering effect of a resonant tank circuit. Its effectiveness in reducing phase noise is dependent upon its loaded Q which is indicative of energy lost per cycle relative to total stored energy in the tank circuit. The energy lost per cycle is that energy dissipated by its reactive elements. The energy output is used to promote the oscillation of the oscillator. Losses due to tuning elements of the tank circuit such as varactor diodes, such as are used in voltage controlled oscillators, are a primary factor in reducing its Q. Loaded Q of the tank circuit is a measure of its ability to successfully filter the phase noise.

Since the ability of resonant tanks to provide high Q decreases with increasing frequency, it becomes increasingly difficult to provide acceptable levels of phase noise at the high RF frequencies required for new wireless communication systems.

Phase noise may be reduced by increasing the Q of the resonant tank circuit. Many methods have been tried to increase the Q of the resonant circuit including insertion of amplifier circuitry in the resonant circuit, isolating the fundamental frequency from the output and compensating for oscillator frequency changes.

The effectiveness of filtering however decreases with frequency of operation as the Q of the tuned circuit decreases resulting to high energy dissipation for cycle. Various implementations of these methods are disclosed in the Art.

An article "Injection Locking of Microwave Solid-State Oscillators" by K. Kurokawa in Proceedings of the IEEE; Vol 61, No 10 (October, 1973) discusses analysis of injection locking of microwave oscillators. A discussion of a random noise vector of oscillation and relation of noise to Q is also included.

U.S. Pat. No. 5,625,324 discloses an Ultra Low Noise Frequency Generator producing a sum of Plural Signal Sources. The signal frequencies of the plural sources are summed to produce a new frequency signal having an output with low noise.

U.S. Pat. No. 5,379,309 illustrates injection locking of two independent laser oscillators to a mode locked oscillator. The objective is a low phase noise oscillator output.

U.S. Pat. No. 5,059,927 discloses a 60 GHz microwave oscillator with reduced phase noise. Phase noise reduction is achieved by selected terminations of the oscillator circuit.

U.S. Pat. No. 5,019,791 concerns flicker (1/f) noise suppression by providing voltage compensation to the tuned circuit varactor to compensate for changes in oscillator frequency.

SUMMARY OF THE INVENTION

Phase noise in an RF oscillator is significantly reduced by loosely couping another quieter RF oscillator having noise patterns uncorrelated to the first RF oscillator so that it frequency locks with the first RF oscillator. The coupling is increased until a significant reduction in phase noise occurs at high coupling levels where the first RF oscillator displays phase noise similar to the the second RF oscillator.

In particular a plurality of substantially identical oscillators are coupled by sympathetic or injection locking to at least one active tuned oscillator which functions as the frequency element of a phase locked loop.

In one embodiment n identical oscillators embodied in an integrated circuit package are coupled with only one of the oscillators connected as an element in a phase locked loop synthesizer with n-1 oscillators essentially unconnected but loosely coupled and free floating. The means of coupling may vary and may include inductive, capacitive or wave coupling.

In yet another aspect a noisy (i.e., phase noise) oscillator is locked to another quieter oscillator by means of sympathetic cross modulation (i.e., sympathetic or injection locking). The coupling attained by locking achieves a reduction in phase noise of the noisy oscillator as coupling increases.

DETAILED DESCRIPTION

An oscillator generates a controlled frequency signal by use of a naturally oscillating tank or other frequency control circuitry which may include a voltage controllable tank or tuned line circuit setting a desired frequency of oscillator operation. For illustrative purposes a microwave oscillator is presented in FIG. 1.

Figure 1:
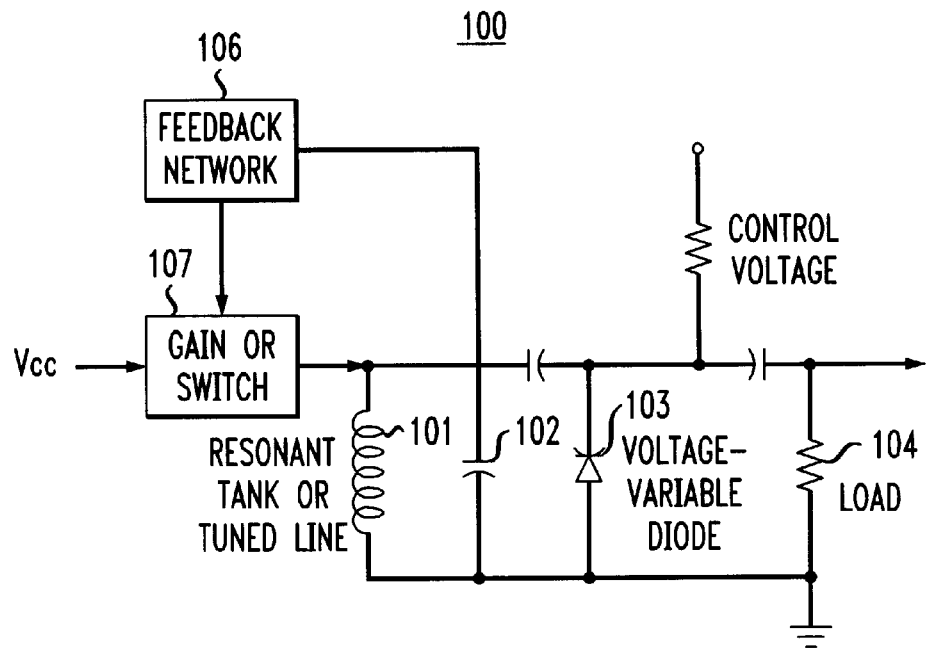
FIG. 1 is a schematic of a conventional voltage controlled oscillator.

In the oscillator 100 shown schematically in FIG. 1 the control mechanism uses a control voltage to modify frequency of a LC tuned circuit with a voltage determined impedance shunting both the Inductor 101 and the capacitor 102 Variable diode 103 is biased by a control voltage as shown in the FIG. 1. Other means which are well known in the art may also be supplied as a frequency control of a tuned circuit. A load circuit 104 connected in parallel with each of the tuned circuit components receives the generated frequency signal.

Positive feedback in the oscillator is supplied by a feedback gain network 106 which supplies the necessary phase and amplitude gain to sustain oscillation in the circuit's active device 107 which may be an amplifying element or a switch device 107.

The output of device 107 drives the tank circuit and through the voltage controlled variable impedance diode 103 controls the frequency of the tank or tuned circuit 111. is a voltage level which affects the impedance of the voltage variable diode 103 whose voltage controlled impedance controls the frequency of the tank or tuned circuit 111 within a specified range of frequencies.

Figure 2:
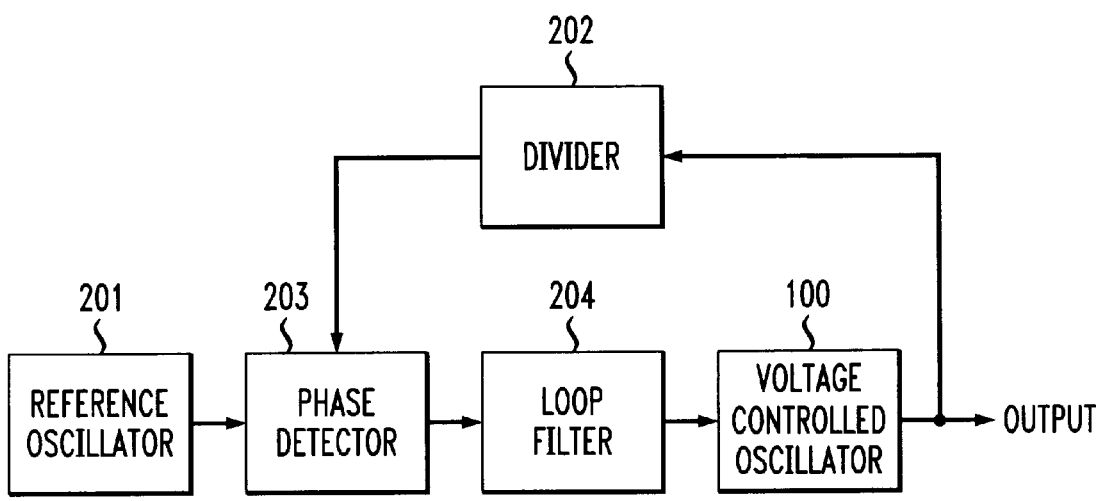
FIG. 2 is a block schematic of a conventional phase locked loop which can utilize the circuit of FIG. 1 as an integral component.

The voltage controlled oscillator 100 is often embedded in a phase-locked loop 200 such as shown in the block schematic of the FIG. 2. A frequency and phase relationship of the output of oscillator 100 is maintained with the frequency and phase of a reference oscillator 201

In operation the output of oscillator 100 is connected to a frequency divider which converts the frequency for feedback purposes. The divided frequency signal is applied to a phase detector 203 which compares the feedback signal with the output of the reference oscillator 201. Detector 203 outputs a phase error signal to a loop filter 204 generating a DC signal with band-limited AC components. This DC signal in turn supplies the frequency control voltage to the voltage controlled oscillator 100.

Figure 3:
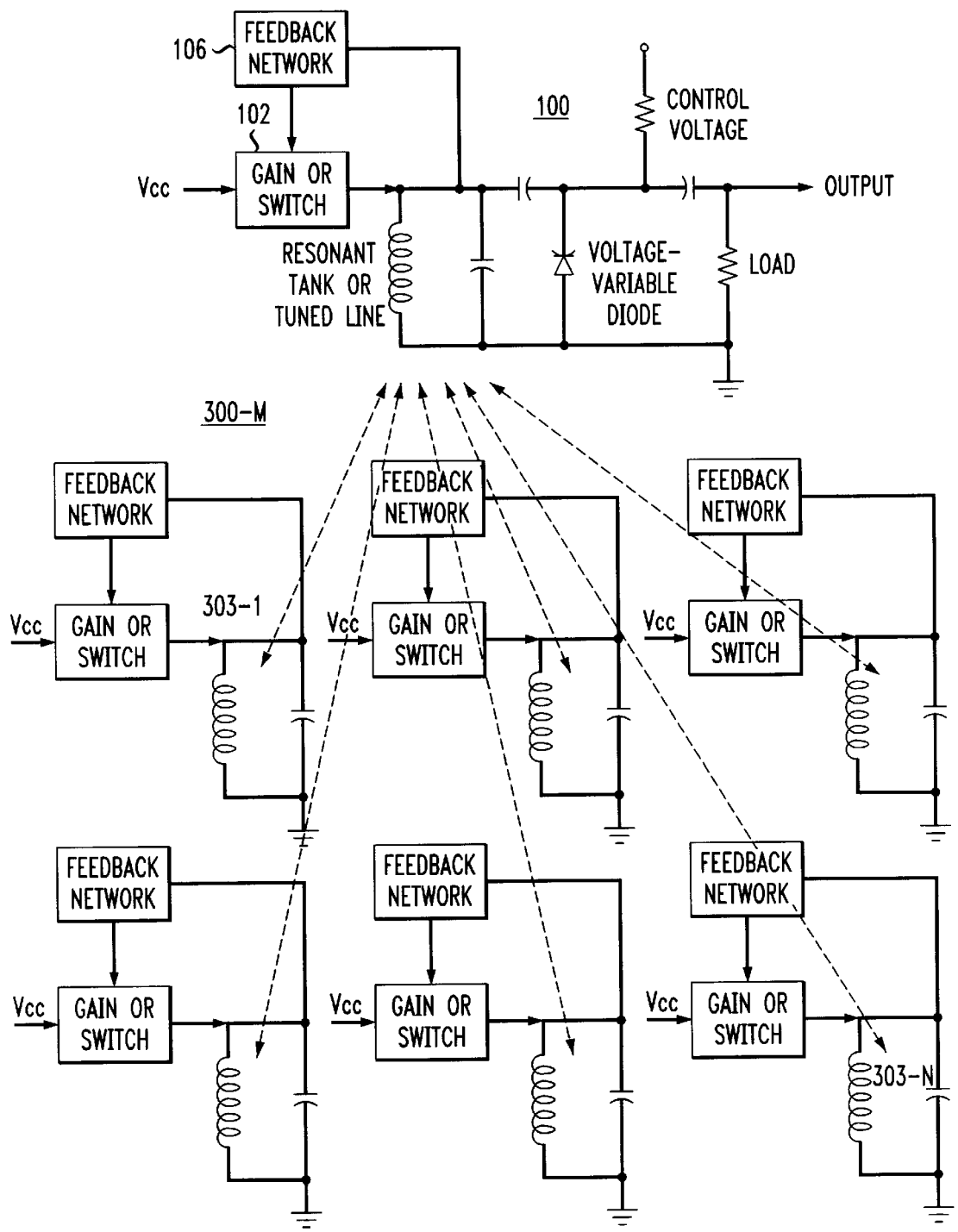
FIG. 3 is a schematic illustrating how phase noise, in the oscillator of FIG. 1 may be controlled and reduced by using a plurality of floating oscillators.

A system for gaining the advantages of sympathetic oscillation in reducing phase noise is shown in schematic form in FIG. 3. This disclosed embodiment comprises an operative oscillator 100 and an array of n identical oscillator circuits 300-N which are lightly coupled to one another and to oscillator 100. One oscillator 100 is used in a phase lock synthesizer. The floating oscillators 300-N are not hardwired to one another but phase lock with one another and to oscillator 100 by sympathetic interaction. The frequency coupling action of the oscillator 100 locks with all the floating oscillators 300-N, so that they are in phase with each other and with the operative oscillator 100.

The frequency of the functional oscillator 100 locks the floating oscillators 300-N which have a higher Q than the utility functional oscillator 100. In this arrangement the overall phase noise is less than any one of the individual oscillators so coupled (i.e., both utility and floating oscillators). As N increases the phase noise is reduced in the utility oscillator by a distinct level.

The floating oscillators each have a resonant or tuned circuit 303-N which is sympathetically coupled to the the controlled tuned circuit of the utility functional oscillator 100. The overall Q is a minimum amount and hence the Q of tuned circuit comprising inductor 101 and capacitor 102 is always maintained high and reduces phase noise.

A satisfactory embodiment may provide the array of floating oscillators in one integrated package which may include the utility oscillator also. Such integrated construction of resonant and oscillator circuits is known to those skilled in the out. The integrated package which may also include the utility oscillator. is one way of assuring similarity of the various circuits and of assuring the spatial proximity needed for assuring sympathetic interaction between the utility and floating oscillators.

In actual operation the collective Q achieved for a plurality of oscillators is always less than or equal to the lowest Q value of any one of the oscillators. Hence phase noise is significantly reduced.

The invention claimed is:

1. A method of reducing phase noise in an actively tuned RF utility circuit (i.e., working frequency output) with an oscillator connected to RF circuitry; comprising the steps of:

loosely coupling a plurality of identical RF oscillators, which are otherwise unconnected to the RF utility circuitry;

selecting identical floating oscillators having uncorrelated phase noise characteristics; and increasing the coupling until a desired phase noise level is attained in the actively tuned RF oscillator.

2. The method of claim 1, wherein:

a further step includes:
    combining the utility oscillator and the floating oscillators in one integrated package.

3. The method of claim 1, wherein:

oscillation frequency is secured by application of voltage control to a tuned circuit.

4. The method of claim 1, wherein:

regulation of the oscillator frequency is achieved by phase lock techniques.

5. The method of claim 1, wherein:

coupling includes a step of achieving closes proximity of floating oscillators by integration techniques.

6. A method of reducing phase noise in a microwave voltage controlled oscillator, comprising the steps of:

controlling the frequency of the microwave voltage controlled oscillator by including a tuned resonant circuit;

assembling a plurality of floating oscillators each including a timing circuit having reactive elements identical to the tuned resonant circuit; spatially locating the floating oscillators in proximity to the controlled oscillator to assure sympathetic interaction between them the interaction resulting in a reduction of phase noise.

* * * * *